United States Patent [19]

Chen et al.

[11] 4,454,221
[45] Jun. 12, 1984

[54] ANISOTROPIC WET ETCHING OF CHALCOGENIDE GLASS RESISTS

[75] Inventors: Cheng-Hsuan Chen; Edith C. Ong, both of New Providence; James C. Phillips, Summit; King L. Tai, Berkeley Heights, all of N.J.

[73] Assignee: AT&T Bell Laboratories, Murray Hill, N.J.

[21] Appl. No.: 366,646

[22] Filed: Apr. 8, 1982

[51] Int. Cl.$^3$ ............................................. G03C 5/00
[52] U.S. Cl. ................................... 430/316; 430/313; 430/317; 430/323; 430/296; 156/643; 156/659.1; 156/904
[58] Field of Search .............. 430/312, 313, 316, 296, 430/17, 311, 317, 323; 156/659.1, 904, 643

[56] References Cited

U.S. PATENT DOCUMENTS

| | | | |
|---|---|---|---|
| 4,127,414 | 11/1978 | Yoshikawa et al. | 430/270 |
| 4,276,368 | 6/1981 | Heller et al. | 430/323 |
| 4,320,191 | 3/1982 | Yoshikawa et al. | 430/296 |
| 4,405,710 | 9/1983 | Balasubramanyam | 430/311 |

OTHER PUBLICATIONS

Tai et al., "Submicron Optical Lithography Using an Inorganic Resist/Polymer Bilevel Scheme," J. Vac. Sci. Technol., 17(5), Sep./Oct. 1980, pp. 1169–1175.

*Primary Examiner*—John E. Kittle
*Assistant Examiner*—José G. Dees
*Attorney, Agent, or Firm*—Bernard Tiegerman; Bruce S. Schneider

[57] ABSTRACT

A method for enhancing linewidth control during the patterning of a substrate with a resist is disclosed. Resists used in the invention have chemically separated structures characterized by two types of regions of different chemical composition, which different types of regions are interspersed among each other. Because the resists used in the present invention have chemically separated structures, anisotropic wet development of these resists is achievable with an appropriate bicomponent wet developer. Consequently, after exposure, the image formed in a thin, upper layer of the resist is transferred with vertical walls through the thickness of the resist.

29 Claims, 5 Drawing Figures

ANISOTROPIC WET ETCHING OF CHALCOGENIDE GLASS RESISTS

BACKGROUND OF THE INVENTION

1. Technical Field

The invention pertains generally to a lithographic process for producing devices such as semiconductor devices, and more particularly to a method involving resists.

2. Art Background

Lithographic processes play an important role in the manufacture of devices such as semiconductor devices. During the manufacture of these devices lithographic processes are used to pattern substrates, such as silicon wafers or processed silicon wafers which are, for example, wholly or partially covered by metal, silicon dioxide, or polysilicon. That is, a substrate is coated with an energy sensitive material called a resist. Selected portions of the resist are exposed to a form of energy which induces a change in the solubility of the exposed portions in relation to a given developing agent or etchant. The more soluble portions of the resist are removed and portions of the substrate are bared by applying the developing agent or etchant to the resist. The bared portions of the substrate are then treated, e.g., are etched or metallized.

Both organic and inorganic materials have been used in resists for the patterning of substrates. Exemplary inorganic materials are chalcogenide glass-based materials, i.e., materials exhibiting a noncrystalline structure and whose major constituent is sulfur, selenium, or tellurium, or combinations thereof. Included among the chalcogenide glass-based materials used as resists are germanium-selenium (Ge/Se) glass films supporting relatively thin layers of silver selenide ($Ag_2Se$). Typically, the Ge/Se films are evaporated or rf-sputtered onto the surface of a substrate. A thin layer of $Ag_2Se$ is formed on the surface of a Ge/Se film by, for example, dipping the film into a $[Ag(CN)_2]^-$-containing aqueous solution, the resulting chemical reactions with the film yielding the $Ag_2Se$. (See R. G. Vadimsky, K. L. Tai, Abstract No. 318, 158th Electrochemical Society Meeting, Hollywood, Fla., Oct. 5-10, 1980.)

When a $Ag_2Se$-covered Ge/Se film is exposed to an appropriate form of energy, silver ions from the $Ag_2Se$ layer migrate into the exposed regions of the Ge/Se glass film, decreasing the solubility of these regions to specific developers. (See e.g., K. L. Tai, L. F. Johnson, D. W. Murphy, M. S. C. Chung, Abstract No. 94, Vol. 79-1, p. 244, Electrochemical Society Meeting, Princeton, N.J., 1979, regarding photo-induced migration of silver into germanium-selenium). Silver migration into Ge/Se glasses is induced, for example, by UV light (in the wavelength range from about 2000 to about 4500 Angstroms), low energy electron beams (having energies ranging from about 1 kev to about 3 kev), and low energy ion beams (including ions such as helium, nitrogen, argon, xenon, and gallium ions with energies ranging from about 10 kev to about 30 kev). (See A. Wagner, D. Barr, T. Venkatesan, W. S. Crane, V. E. Lamberti, K. L. Tai, R. G. Vadimsky, *Journal of Vacuum Science Technology*, 19(4), Nov./Dec. 1981, regarding the use of low energy ion beams).

After a Ge/Se film is exposed to energy, the $Ag_2Se$ remaining on the surface of the film is removed. This is done, for example, by immersion in a $KI/KI_3$ solution which converts $Ag_2Se$ to $AgI$ and dissolves the latter by forming $KAgI_2$. Thereafter, the Ge/Se film is either dry developed, or more conveniently wet developed by dissolving the nonexposed Ge/Se in a strongly alkaline (pH of about 12.5) aqueous solution, e.g., a sodium hydroxide solution. Sodium sulfide has been added to developers used to develop Ge/Se films containing 90 atomic percent Se, in order to assist in the removal of the relatively large amount of Se in these films. (See R. G. Vadimsky, K. L. Tai, Abstract No. 318, 158th Electromechanical Society Meeting, Hollywood, Fla., Oct. 5-10, 1980 regarding wet development of Ge/Se resists).

One of the advantages associated with germanium-selenium inorganic resists is their high absorbance of various forms of energy, including UV light, low-energy electron beams, and low-energy ion beams. That is, at least 60 percent of these energies, when incident on germanium-selenium resists, is absorbed within a thin image layer about 100 to 300 Angstroms thick. Consequently, if a pattern of lines and spaces is delineated in a germanium-selenium inorganic resist, the variation in the desired widths of the lines and spaces will be relatively small (less than or equal to about 10 percent), as compared to most organic resists. That is, good linewidth control is achieved with germanium-selenium resists because little or no energy penetrates beyond the 100 to 300 Angstrom-thick image layer, and thus reflections from the substrate supporting the germanium-selenium resist, with their attendant degradation in linewidth control, are avoided.

Another advantage associated with germanium-selenium inorganic resists is the ability of these resists to resolve feature sizes smaller than 1 $\mu$m while achieving excellent linewidth control (variations in linewidth less than or equal to about 10 percent). It is believed that this is due to the so-called edge-sharpening effect. (Tai et al, Abstract No. 318, 158th Electrochemical Society Meeting, Hollywood, Fla., Oct. 5-10, 1980, and Tai et al, "Submicron optical lithography using an inorganic resist/polymer bilevel scheme," *Journal of Vacuum Science Technology*, 17 (5), Sept./Oct. 1980, pp. 1169-1175, have explained this desirable effect).

Germanium-selenium resists are often used in combination with relatively thick organic polymers. The thick organic polymers are used to planarize stepped surfaces, i.e., to present a flat surface to the germanium-selenium resists so that their high resolution capabilities can be exploited. In addition, the thick organic polymers are used as masks for dry etching substrates.

When a germanium-selenium resist is used in combination with a thick organic polymer, the polymer, having a thickness of about 2$\mu$, is first spun onto the substrate. Then, a relatively thin film of germanium-selenium, having a thickness of about 2000 Angstroms, is evaporated or rf-sputtered onto the thick organic polymer. After a pattern is defined in the germanium-selenium film, i.e., after the germanium-selenium film is exposed and developed, the pattern is readily transferred to the organic polymer by reactive ion etching which etches the polymer but not the germanium-selenium film. Generally, the germanium-selenium film is removed and the etched organic polymer then serves as a mask for patterning the substrate.

As discussed above, Ge/Se glass resists have desirable attributes. However, improvement in linewidth control is always desirable.

SUMMARY OF THE INVENTION

The invention is directed to a method for patterning substrates with specially chosen chalcogenide glass resists, having structures which allow these resists to be anisotropically wet developed after being exposed. In particular, chalcogenide glasses having chemically separated structures are chosen. These chemically separated chalcogenide glasses have structures characterized by two types of regions of different chemical composition, which regions are interspersed among each other. Exemplary chalcogenide glass resists used in the present invention are Ge/Se resists having compositions represented by the formula $Ge_xSe_{1-x}$ where x is greater than 0.1 but less than 0.2.

Because the chalcogenide glass resists used in the present invention have two types of regions of different chemical composition, anisotropic wet development is achievable with an appropriate bicomponent wet developer. An appropriate bicomponent wet developer is one having two components, at least one of which preferentially develops one of the two types of regions of different chemical composition. As a result of the anisotropic wet development, there is little or no undercutting of the thin image layer formed in the exposed resist, and the image is transferred with vertical walls through the thickness of the resist. Consequently, linewidth control is enhanced. That is, the relatively small variation in linewidth associated with the image defined in the image plane is maintained during the transfer of this image through the thickness of the resist.

BRIEF DESCRIPTION OF THE DRAWINGS

Embodiments of the inventive patterning method are described with reference to the accompanying drawings, wherein.

DETAILED DESCRIPTION

Figure 1:
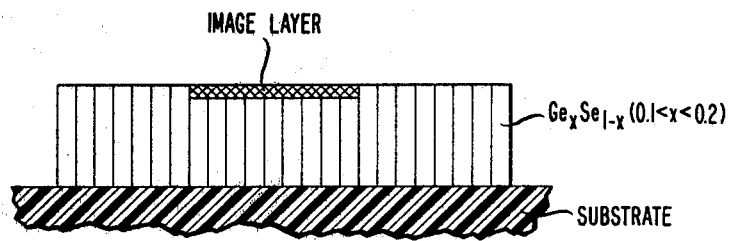
FIG. 1 is a cross-sectional view of an exposed germanium-selenium film used in the inventive patterning method.

The present invention relates to a method for enhancing linewidth control during the patterning of substrates with chalcogenide glass resists. According to the invention, only those chalcogenide glass resists which exhibit a chemically separated structure, i.e., a structure characterized by two types of regions of different chemical composition, and which regions are interspersed among each other, are used. Such resists are advantageous because they are readily anisotropically etched with appropriately chosen bicomponent wet developers, and are thus useful in enhancing linewidth control. Moreover, those chalcogenide glass resists which exhibit chemically separated structures are readily found from among those glass compositions which, on a phase diagram, lie between two crystalline compounds. If a particular composition is chemically separated, then this is readily determined by successively applying two different etchants, each of which preferentially etches one of the crystalline compounds. If the two etchants remove different materials from different regions of the glass composition, then the glass composition has a chemically separated structure. For purposes of illustration, the present invention is described with reference to Ge/Se glass resists chosen to be in a specific compositional range having chemically separated structures.

Germanium-selenium glass resists having the desired chemically separated structure are characterized by $GeSe_2$-rich areas interspersed among Se-rich areas. These particular compositions of Ge/Se are of the form $Ge_xSe_{1-x}$ where $0.1 < x < 0.2$, and preferably where $0.13 \leq x \leq 0.17$. Thus, $Ge_xSe_{1-x}$ glass films are anisotropically wet etched with appropriate bicomponent wet developers provided $0.1 < x < 0.2$. Moreover, it has been found that anisotropic wet etching is enhanced if $0.13 \leq x \leq 0.17$. Therefore, it is the nominal composition of the Ge/Se glass which determines whether or not it is chemically separated and can thus be anisotropically wet etched.

In a first embodiment of the invention, a chalcogenide glass film, e.g., a Ge/Se glass film, is deposited onto a substrate to be processed. Generally, the chalcogenide glass film should have a thickness in the range from about 500 Angstroms to about 3000 Angstroms. Glass films having thicknesses less than about 500 Angstroms are undesirable because such films lack integrity, e.g., have pinholes, while glass films having thicknesses greater than about 3000 Angstroms are undesirable because they require an excessively long time to develop. The method of depositing the chalcogenide glass film, e.g., a Ge/Se glass film, is not critical. Conventional techniques, such as evaporation and rf-sputtering, are useful. The nominal composition of the Ge/Se glass film is of the form $Ge_xSe_{1-x}$ where $0.1 < x < 0.2$ and preferably $0.13 \leq x \leq 0.17$. The compositions of these glasses can be readily determined by, for example, X-ray fluorescence measurements.

After a $Ge_xSe_{1-x}$ glass film, having a composition resulting in chemical separation, i.e., a composition such that $0.1 < x < 0.2$, is deposited onto the substrate to be processed, a silver compound-containing layer is formed on the upper surface of the glass film. One procedure for forming this layer is to immerse the glass-covered substrate in an appropriate sensitizing bath. For example, a $Ag_2Se$ layer is formed on the glass film by immersing the glass-covered substrate in $[Ag(CN)_2]^-$-containing aqueous solution. One $[Ag(CN)_2]^-$-containing aqueous solution is, for example, aqueous $KAg(CN)_2$. It is desirable to form the $Ag_2Se$ layer, which should be at least 30 Angstroms thick, in a convenient time period, e.g., about 20 seconds to about 2 minutes. To obtain deposition rates that permit this to be achieved, the silver ion concentration in the bath is preferably within the range extending from about 0.001 M to about 0.3 M. The solution should be basic, i.e., have a pH ranging from about 10 to about 11, to form the $Ag_2Se$ layer. As described in U.S. patent application Ser.No. 263,684, filed by A. Heller and R. G. Vadimsky on May 14, 1981, and which is hereby incorporated by reference, proper operation of the sensitizing bath requires a small $CN^-$ concentration in excess of the stoichiometric concentration for the reaction $[Ag(CN)_2]^- \rightarrow CN^- + AgCN$. One convenient expedient for providing the small increase in $CN^-$ concentration is by adding KCN to the bath. The amount of excess cyanide concentration is preferably in the range 0.001 M to 1.0 M. A $Ag_2Se$ layer, having a thickness greater than about 30 Angstroms, is formed on the $Ge_xSe_{1-x}$ glass film by immersing the glass-coated substrate in the bath at a temperature of, for example, 25 degrees Centigrade, for a residence time between approximately 20 seconds and 2 minutes. Thicknesses of the Ag$_2$Se layer less than about 30 Angstroms are undesirable because such thicknesses contain insufficient amounts of silver to adequately silver-dope the Ge$_x$Se$_{1-x}$ film during the exposure step, described below. On the other hand, the thickness of the Ag$_2$Se layer should be no greater than, and preferably less than, the penetration depth of the energy used in the exposure step to allow silver migration into the exposed Ge$_x$Se$_{1-x}$ glass film.

After the Ag$_2$Se layer is formed on the glass, a desired pattern is delineated in the Ge$_x$Se$_{1-x}$(0.1<x<0.2) glass film by exposing selected portions of the glass to energy which is to be absorbed within a thin layer, such as UV light (in the wavelength range from about 2000 to about 4500 Angstroms), low energy electron beams (having energies ranging from about 1 kev to about 3 kev), or low energy ion beams (including ions such as helium, nitrogen, argon, xenon, and gallium ions, with energies ranging from about 10 kev to about 30 kev). The energy is absorbed within what is termed an image layer, which is within approximately 100 to 300 Angstroms of the surface upon which the energy is incident. The incident energy induces silver migration into the image layer, making the image layer much less soluble than nonexposed portions of the glass in relation to specific developers.

Before the glass is developed, the Ag$_2$Se remaining on the surface of the glass is removed. This is done, for example, by immersion in a KI/KI$_3$ solution which converts the Ag$_2$Se to AgI and dissolves the latter by forming the complex KAgI$_2$. The concentration of KI in this bath ranges from about 1 M to about 2 M, while the concentration of KI$_3$ ranges from about 0.003 M to about 0.01 M. The duration of immersion in this stripping bath ranges from about 10 sec to about 100 sec. Concentrations of KI and KI$_3$ less than those indicated above, and immersion durations less than about 10 sec, lead to incomplete stripping of the Ag$_2$Se. Concentrations of KI and KI$_3$ greater than those indicated above, and immersion durations greater than about 100 sec, result in the image layer being chemically attacked by the stripping solution.

One aspect of the invention resides in the fact that after the stripping of the remaining silver compound-containing layer, e.g., Ag$_2$Se, the unexposed Ge$_x$Se$_{1-x}$(0.1<x<0.2) glass film is anisotropically wet etched. The term "anisotropic" etching means that the extent to which the glass beneath a mask, such as the silver-doped image layer, is laterally etched is less than about one-half the thickness of the glass film. Two conditions must be satisfied to achieve anisotropic wet etching. First the wet developer which is used should include at least two chemical components. The two components are chosen so that at least one of them is a selective etchant, i.e., an etchant which preferentially etches one chemical compositional region, e.g., GeSe$_2$ or Se. In one embodiment of the invention, the second component is a nonselective etchant, i.e., the second component etches two compositional regions, e.g., GeSe$_2$ and Se. In another embodiment of the invention, the second component is also a selective etchant which preferentially etches Se, for example, if the first component preferentially etches GeSe$_2$. The two components are also chosen so that the silver-doped image layer is relatively insoluble in relation to the two components. Chemical components having these properties are readily found in the literature. (See, e.g., *Gmelin Handbook of Inorganic Chemistry*, 8th Edition (Springer Verlag, 1981); *Comprehensive Inorganic Chemistry*, edited by Bailar et al (Pergamon Press); and *A. Comprehensive Treatise on Inorganic And Theoretical Chemistry*, by J. W. Mellor (Longmans, Green and Co. Ltd., 1927)). In addition, the ratio of the concentrations of the two components is chosen so that the etching rate of the selective component is relatively fast as compared to the etching rate of the nonselective component. If both components are selective etchants, then the concentration ratio is chosen so that the etching rate of the first component, for example, is relatively fast as compared to the etching rate of the second component. This is one of the two conditions which should be satisfied for the glass film, which is chemically separated into GeSe$_2$-rich areas and Se-rich areas, to be anisotropically etched.

Included among the chemicals which preferentially etch GeSe$_2$ are aqueous base solutions such as aqueous tetra methyl ammonium hydroxide, sodium hydroxide, and potassium hydroxide. Both GeSe$_2$ and Se are etched, for example, by sulfide ions (S$^{-2}$) which are conveniently introduced via aqueous Na$_2$S. Furthermore, borohydrides, such as sodium borohydride, preferentially etch, i.e., reduce, Se. Moreover, the silver-doped image layer is relatively insoluble in relation to these developers.

Appropriate concentration ratios for the two components are dependent on the composition of the Ge$_x$Se$_{1-x}$ (0.1<x<0.2) glass, and are determined empirically. For example, by subjecting a Ge$_x$Se$_{1-x}$ control sample to a bicomponent developer, and by varying the concentrations of the selective and nonselective components, the rates at which GeSe$_2$-rich areas and Se-rich areas are etched can be readily monitored by, for example, X-ray fluorescence techniques. An appropriate concentration ratio for the two components is then readily chosen and is one for which the etching rate of the selective component is relatively fast as compared to the etching rate of the nonselective component.

The second condition which should be satisfied to achieve anisotropic wet etching is that a lateral dimension of the Se-rich areas is less than the thickness of the glass film.

A contemplated explanation of why the glass film is anisotropically etched is conveniently given with reference to FIG. 1, which is a cross-sectional view of an exposed Ge$_x$Se$_{1-x}$(0.1<x<0.2) glass film. The relatively thin, silver-doped image layer at the top of the glass film is relatively insoluble in the presence of the bicomponent developer. When the bicomponent developer is applied to the upper surface of the glass film, the unexposed glass directly beneath the silver-doped image layer is protected from the etching action of the developer. However, the unexposed and unprotected surface of the glass, i.e., the surface to the right and to the left of the image layer (as viewed in FIG. 1), is readily etched by the bicomponent developer. If, for example, the first component preferentially etches GeSe$_2$ at a relatively fast rate and the second component preferentially etches Se at a relatively slow rate, then the GeSe$_2$-rich areas are etched relatively quickly from the top to bottom, while the Se-rich areas are etched relatively slowly from top to bottom. It should be noted that the GeSe$_2$-rich areas and Se-rich areas are thought to have columnar geometries, and are so pictured in FIG. 1.

As the GeSe$_2$-rich areas are etched away from top to bottom, the lateral surfaces of the Se-rich areas are exposed to the developer. Consequently, the Se-rich areas are then etched laterally. Although the Se-rich areas are etched at a slow rate by the second component, the complete dissolution of all the Se-rich areas essentially requires just enough time to etch through about half the lateral extent of a single Se-rich area. With respect to the GeSe$_2$-rich and Se-rich areas beneath the silver-doped image layer, these areas cannot be etched from the top because the silver-doped image layer shields them from the etching action of the bicomponent developer. However, once the areas not covered by the image layer have been etched, the developer then attacks the areas beneath the image silver laterally. The glass beneath the image layer is etched relatively slowly because the Se-rich areas are etched slowly by the second component, and these areas are only etched laterally one-by-one starting at the perimeter of the image layer. Although the first component etches the GeSe$_2$-rich areas laterally relatively quickly, the first component does not attack these areas until intervening Se-rich areas have first been etched away. Thus, the dissolution rate of the glass beneath the image layer is limited by the dissolution rate of the Se-rich areas. But in the time required for the dissolution of virtually all the glass not covered by the image layer, only a relatively small amount of the glass beneath the image layer is laterally etched, resulting in the anisotropic wet etching of the glass film.

The condition that the lateral dimension of the Se-rich areas be less than the thickness of the glass film ensures that the lateral etching of the glass beneath the image layer is limited to less than half the thickness of the glass film.

It should be noted that variations in the concentration ratios of the bicomponent developers used to etch Ge$_x$Se$_{1-x}$ (0.1<x<0.2) glass films are not very effective in offsetting variations in composition. That is, for example, increasing the concentration of the component which preferentially etches GeSe$_2$, as compared to the concentration of the component which etches Se, will not produce a corresponding increase in the rate at which GeSe$_2$-rich areas are etched as compared to the rate at which Se-rich areas are etched, in compositions having reduced chemical separation. Thus, it has been found that the composition of the glass is the most important factor in determining whether, and the extent to which, anisotropic etching is achieved.

After the Ge$_x$Se$_{1-x}$ (0.1<x<0.2) glass film is anisotropically wet etched, the film then serves as a mask for treating the bared portions of the substrate.

In a second embodiment of the inventive process, an energy sensitive material, e.g., an energy sensitive organic polymer, such as poly(methyl methacrylate), is deposited on the Ge$_x$Se$_{1-x}$ (0.1<x<0.2) glass film, after the film has been deposited on the substrate. The energy sensitive material is then exposed to a form of energy which changes the solubility of the exposed portions in relation to specific developers. Thereafter, the exposed, energy sensitive material is wet or dry developed, and then used as a mask during the anisotropic wet etching of the glass film. Thus, in this embodiment, the exposed and developed energy sensitive material serves the same function the thin, silver-doped image layer served in the first embodiment of the invention. After the glass film is anisotropically wet etched, the energy sensitive material is removed, and the Ge$_x$Se$_{1-x}$ glass film is used as a mask to treat the substrate.

In a third embodiment of the inventive patterning process, useful in patterning substrates having non-planar topographies, i.e., having stepped surfaces, a relatively thick organic polymer is first spun onto the substrate. The thickness of the polymer is chosen to be sufficient to planarize the substrate, i.e., to present a flat, planar surface to a Ge$_x$Se$_{1-x}$ glass film. Typically, the thickness of the organic polymer ranges from about 1 $\mu$m to about 3 $\mu$m. Polymer layers having a thickness less than 1 $\mu$m are undesirable because they do not provide adequate step coverage. On the other hand polymer layers thicker than 3 $\mu$m are generally undesirable because they require the excessively long time to etch, which is uneconomical.

After the organic polymer is deposited onto the substrate, a Ge$_x$Se$_{1-x}$ (0.1<x<0.2) glass film, about 500 to about 3000 Angstroms thick, is deposited onto the organic polymer. Thereafter, a pattern is delineated in the glass, i.e., the glass is sensitized, exposed, and anisotropically wet developed, as described above. Alternatively, the procedure used with the second embodiment is employed.

After the pattern has been delineated in the glass, the pattern is transferred from the glass into the organic polymer with vertical walls. One procedure for doing so is to etch the polymer by O$_2$ reactive ion etching. The image is transferred with vertical walls through the thickness of the polymer because the developed Ge$_2$Se$_{1-x}$ glass film has vertical walls, i.e., there is relatively little undercutting of the glass beneath the image layer, and the glass is resistive to O$_2$ plasmas. Thereafter, the glass film is removed, e.g., by first applying a solvent which includes 2½ percent by weight sodium hypochlorite, and then applying a solvent which includes 10 percent by weight sodium thiosulfate. The organic polymer then serves as a vertical-walled mask during the patterning of the substrate. Thus, in this embodiment, the glass film serves as an imaging layer while the organic polymer serves as a mask for the patterning of the substrate.

Figure 2:
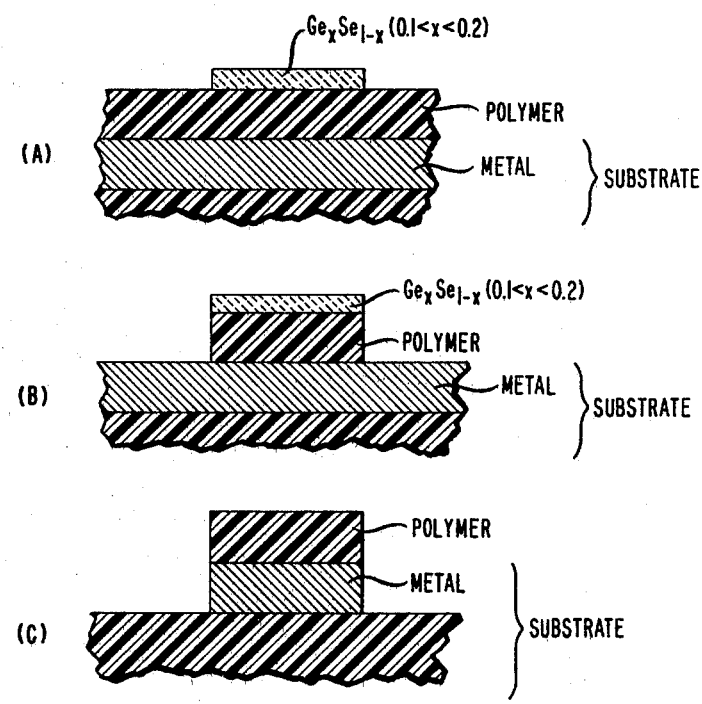
FIGS. 2(a)–2(c) depict the steps involved in patterning a substrate which includes a layer of metal, with one embodiment of the inventive patterning method.

By way of example, FIGS. 2(a)–2(c) depict how the third embodiment of the inventive patterning process is used to pattern the metal of a substrate which includes a surface layer of metal. That is, a relatively thick organic polymer, ranging in thickness from about 1 $\mu$m to about 3 $\mu$m, is spun onto the substrate. Then, a Ge$_x$Se$_{1-x}$ glass film (0.1<x<0.2), ranging in thickness from about 500 Angstroms to about 3000 Angstroms, is deposited onto the organic polymer. A pattern is then delineated in the glass film. That is, the glass film is sensitized, selectively exposed to energy, and then anisotropically wet developed. Alternatively, the procedure used in the second embodiment of the invention is employed.

After a pattern is delineated in the glass film, this pattern is transferred into the organic polymer with essentially vertical walls. This is done, for example, by using O$_2$ reactive ion etching. Then, the pattern delineated in the organic polymer is transferred into the metal layer with essentially vertical walls. This is done, for example, by using the patterned organic polymer as a mask during the chlorine or fluorine plasma etching of the metal. The glass film is removed prior to the chlorine or fluorine plasma etching of the metal because the Ge$_x$Se$_{1-x}$ glass film is thin and is readily attacked by chlorine and fluorine plasmas. While the organic polymer is also attacked by chlorine and fluorine plasmas, the polymer is relatively thick and can more readily withstand these plasmas. Moreover, while succcessive horizontal layers of the organic polymer are etched away by the chlorine or fluorine plasma, the etched metal will have vertical walls because the organic polymer has vertical walls. That is, chlorine or fluorine ions impinge the organic polymer more or less perpendicularly, and if the walls of the polymer are vertical, relatively little lateral etching is produced.

Figure 3:
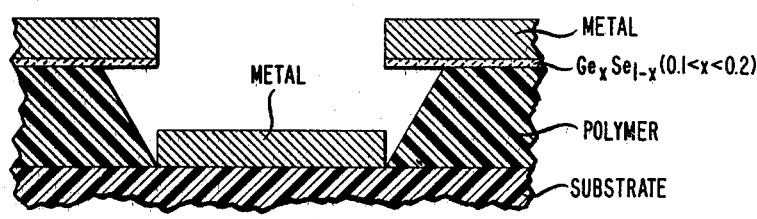
FIG. 3 depicts the metallization of a substrate using a variation of the procedure depicted in FIGS. 2(a)–2(c).

In a variation of the third embodiment of the inventive patterning process, which is advantageously used with substrates which are to be metallized and which have planar or non-planar topographies, an organic polymer is first spun onto the substrate. The thickness of the polymer ranges from about 1 $\mu$m to about 3 $\mu$m. Then a $Ge_xSe_{1-x}$ ($0.1 < x < 0.2$) glass film, 500 to 3000 Angstroms thick, is deposited onto the polymer. Thereafter, a pattern is delineated in the glass film. That is, the glass film is sensitized, selectively exposed to energy, and then anisotropically wet developed. Alternatively, the procedure used in the second embodiment of the invention is employed. Then, as shown in FIG. 3, the organic polymer is isotropically developed with an appropriate developer. That is, the polymer is chosen so that it undergoes isotropic development when subjected to an appropriate developer. Metal is then deposited onto the substrate, the glass film serving as a mask during this metallization procedure. Linewidth control is enhanced during the metallization step because the glass film has vertical walls. Because the organic polymer was isotropically developed, and thus undercut, i.e., etched laterally, there is no lift-off problem. That is, both the glass film and the metal deposited onto the glass film are readily removed. Finally, the organic polymer is removed with an appropriate solvent.

EXAMPLE 1

The amount of chemical separation exhibited by different compositions of $Ge_xSe_{1-x}$ glass films was determined by depositing a 2000 Angstrom-thick layer of each composition onto a silicon wafer. In each case the silicon wafer was mounted on a planetary fixture arranged within an evacuated chamber, and the method of deposition was by electron beam evaporation. The pressure within the evacuated chamber was less than $5 \times 10^{-6}$ torr, the electron beam power was 300 watts, and the deposition rate was 5 Angstroms per second.

After deposition, each $Ge_xSe_{1-x}$ glass film was successively etched by an aqueous solution of 0.1 M tetra methyl ammonium hydroxide (TMAH) and an aqueous solution of 0.01 M sodium sulfide. The composition of each glass film was checked by X-ray fluorescence prior to these etching procedures. In addition, the composition of the material removed by each etchant, as well as the etching rate of each etchant, was measured by X-ray fluorescence. The following table lists the composition of each $Ge_xSe_{1-x}$ glass film, the composition of the material removed by each etchant, and the ratio of the rate at which $GeSe_2$ was etched by the TMAH to the rate at which Se was etched by the sodium sulfide.

| Composition of glass | Composition of Etched Material | | Etching Ratio (GeSe$_2$/Se) |
|---|---|---|---|
| $Ge_xSe_{1-x}$ | 0.1M TMAH | 0.1M Na$_2$S | |
| $Ge_{.10}Se_{.90}$ | $GeSe_2$ | $Ge_{.10}Se_{.90}$ | 0.56 |
| $Ge_{.13}Se_{.87}$ | $GeSe_2$ | $Ge_{.13}Se_{.87}$ | 2 |
| $Ge_{.15}Se_{.85}$ | $GeSe_2$ | $Ge_{.15}Se_{.85}$ | 10 |
| $Ge_{.17}Se_{.83}$ | $GeSe_2$ | $Ge_{.17}Se_{.87}$ | 5.5 |
| $Ge_{.20}Se_{.80}$ | $Ge_{0.2}Se_{0.8}$ | $Ge_{.20}Se_{.80}$ | 1 |

The results listed in the above table indicate that TMAH preferentially etched $GeSe_2$, while the $Na_2S$ etched both $GeSe_2$ and Se. Because the concentrations of the two etchants were the same in each case, i.e., 0.1 M TMAH and 0.01 M $Na_2S$, the etching ratio for each composition should have increased with increasing x if each had the same degree of chemical separation into $GeSe_2$-rich areas and Se-rich areas. Moreover, because the concentration of TMAH was ten times greater than that of $Na_2S$, the etching ratio for each composition should have been greater than one if that composition had a significant amount of chemical separation into $GeSe_2$-rich areas and Se-rich areas. But of the five compositions tested only $Ge_{0.13}Se_{0.87}$, $Ge_{0.15}Se_{0.85}$, and $Ge_{0.17}Se_{0.83}$ had etching ratios greater than 1.0, which means that only these compositions showed significant chemical separation. Thus, these compositions are readily anisotropically etched with an appropriate bicomponent developer.

The three compositions which showed chemical separation, i.e., $Ge_{0.13}Se_{0.87}$, $Ge_{0.15}Se_{0.85}$, and $Ge_{0.17}Se_{0.83}$, were then tested to determine their sensitivity, in terms of producing anisotropic etching, to different concentration ratios of a bicomponent developer. That is, glass resists having these compositions were evaporated onto silicon wafers.

After the evaporation step, a 1$\mu$ thick poly (methyl methacrylate) (PMMA) layer was spun onto each $Ge_x$-$Se_{1-x}$ resist. The PMMA layer was then exposed to deep UV light (200-250 nanometers) through a resolution mask consisting of different sized lines and spaces ranging in size from 1$\mu$ to 5$\mu$. The exposure method was contact printing. The total energy flux was 2 joules/cm$^2$. After exposure, the PMMA layer was etched with methyl isobutyl ketone, resulting in the delineation of a pattern in the PMMA.

Using the patterned PMMA as a mask, each glass-coated wafer was then etched with a series of bicomponent wet developers, each of which included different concentrations of TMAH and $Na_2S$. It was found that $Ge_{0.13}Se_{0.87}$ was anisotropically etched, i.e., the image layer was laterally etched by less than half the thickness of the glass film, provided the concentration ratio of TMAH to $Na_2S$ was greater than 15. It was also found that $Ge_{0.15}Se_{0.85}$ was anisotropically etched provided the concentration ratio was greater than 5. Finally, it was found that $Ge_{0.17}Se_{0.83}$ was anisotropically etched provided the concentration ratio was greater than 10. Thus, $Ge_{0.15}Se_{0.85}$ is most readily anisotropically etched, even at relatively low concentration ratios, while $Ge_{0.13}Se_{0.87}$ and $Ge_{0.17}Se_{0.83}$ require relatively high concentration ratios to produce anisotropic etching. It is believed that this is due to the fact that $Ge_{0.15}Se_{0.85}$ has greater chemical separation than either $Ge_{0.13}Se_{0.87}$ or $Ge_{0.17}Se_{0.83}$.

EXAMPLE 2

A silicon wafer bearing a 3500 Angstrom thick, thermally oxidized layer of $S_iO_2$ was patterned by depositing a 2000 Angstrom thick film of $Ge_{0.15}Se_{0.85}$ glass onto the wafer. The deposition method was electron beam evaporation, and deposition conditions were those recited in Example 1.

The glass-coated wafer was immersed in an aqueous solution of 0.007 M KAg(CN)$_2$ and 0.021 M KCN for 40 seconds. The wafer was then rinsed in deionized water and air dried at room temperature (23.5° C.) to yield a coating of Ag$_2$Se on the glass film. The nominal thickness of the Ag$_2$Se coating was 100 Angstroms.

A pattern was delineated in the Ge$_{0.15}$Se$_{0.85}$ glass film by exposing the glass film to UV light through the resolution mask of Example 1. The wavelength of the UV light was 4000 Angstroms. The method of exposure was by projection printing, the projection printer having a numerical aperture equal to 0.16.

The Ag$_2$Se remaining on the surface of the glass film after the exposure step was stripped by immersing the wafer, for 30 seconds, in a stripping solution which included 2 M KI and 0.007 M KI$_3$. The wafer was then rinsed in deionized water.

The glass film was then developed by immersing the wafer, for about 4 minutes, in a bicomponent developer solution which included 0.15 M tetra methyl ammonium hydroxide and 0.015 M sodium sulfide. Scanning electron micrographic photographs showed that the glass had undergone less than 500 Angstroms of lateral etching.

The bared portions of the S$_i$O$_2$ were then etched with a wet developer sold under the trade name BOE and purchased from the Allied Chemical Corporation of New Jersey. The BOE used contained 10 to 1 buffered HF, i.e., the BOE contained 10 volumes of water to each volume of HF. Scanning electron micrographic photographs showed that 1 $\mu$m lines and spaces had been resolved in the S$_i$O$_2$, but with some undercutting produced by the BOE.

EXAMPLE 3

A silicon wafer bearing a 1000 Angstrom thick layer of S$_i$O$_2$ supporting a 6000 Angstrom thick layer of polysilicon was patterned by spinning a novolac resin onto the wafer. The nominal thickness of the novolac was 1.5$\mu$.

The novolac resin-coated wafer was then baked for one hour at 200° C. Thereafter, a 2000 Angstrom thick film of Ge$_{0.15}$Se$_{0.85}$ was evaporated onto the novolac resin, sensitized, exposed, stripped, and developed, using the procedures described in Example 1.

Reactive ion etching in oxygen at a pressure of 5 micrometers of mercury and a power of 100 watts for 40 minutes resulted in a transfer of the pattern in the glass film onto the novolac resin with essentially vertical walls. The Ge$_{0.15}$Se$_{0.85}$ glass film was then removed by first applying a solvent which included 2½ percent by weight sodium hypochlorite and then applying a solvent which included 10 percent by weight sodium thiosulfate.

Using the patterned novolac resin as a mask, the bared portions of the polysilicon were then etched using CFCl$_3$ reactive ion etching followed by Cl$_2$ plasma etching. Scanning electron micrographic photographs showed virtually no undercutting of the pattern delineated in the polysilicon.

What is claimed is:

1. A method for fabricating an article which includes a surface, comprising the steps of:
    exposing selected portions of a resist, on said surface, to energy; and
    treating said resist with a wet developing agent to remove nonexposed portions of said resist, characterized in that
    the nonexposed portions of said resist removed by said wet developing agent include regions having a first chemical composition and regions having a second chemical composition, the regions having said first chemical composition being interspersed among the regions having said second chemical composition, and a lateral dimension of the regions having said second chemical composition being less than the thickness of the resist, and
    said wet developing agent includes first and second chemical components, said first chemical component preferentially etching the regions having said first chemical composition, and the etching rate of said first chemical component being greater than the etching rate of said second chemical component.

2. The method of claim 1 wherein said resist includes a chalcogenide glass.

3. The method of claim 2 wherein said chalcogenide glass is a germanium-selenium glass having a nominal composition Ge$_x$Se$_{1-x}$ where $0.1 < x < 0.2$, and wherein the regions having said first chemical composition include GeSe$_2$ and the regions having said second chemical composition include Se.

4. The method of claim 3 wherein $0.13 < x < 0.17$.

5. The method of claim 3 wherein said first chemical component includes a hydroxide compound.

6. The method of claim 5 wherein said hydroxide compound is tetra methyl ammonium hydroxide.

7. The method of claim 5 wherein said hydroxide compound is sodium hydroxide.

8. The method of claim 5 wherein said hydroxide compound is potassium hydroxide.

9. The method of claim 3 wherein said second chemical component includes a sulfide compound.

10. The method of claim 9 wherein said sulfide compound is sodium sulfide.

11. The method of claim 3 wherein said second chemical component includes a borohydride compound.

12. The method of claim 11 wherein said borohydride compound is sodium borohydride.

13. The method of claim 3 wherein said energy includes UV light having a wavelength ranging from about 2000 Angstroms to about 4500 Angstroms.

14. The method of claim 3 wherein said energy includes electrons having energies ranging from about 1 kev to about 3 kev.

15. The method of claim 2 wherein said energy includes ions having energies ranging from about 10 kev to about 30 kev.

16. The method of claim 1 wherein there is a polymeric layer between said resist and said article surface.

17. The method of claim 16 further comprising the step of processing said polymeric layer to produce a replica pattern by exposing the article product resulting from the fabrication method of claim 1 to an agent which selectively attacks portions of said polymeric layer bared during patterning of said resist.

18. The method of claim 17 wherein said replica pattern in said polymeric layer is produced by O$_2$ reactive ion etching.

19. The method of claim 17 wherein there is a metal layer beneath said polymeric layer on said article surface.

20. The method of claim 19 further comprising the step of patterning said metal layer by exposing the article product resulting from the fabrication method of claim 17 to an agent which selectively attacks portions of said metal layer bared during patterning of said polymeric layer.

21. The method of claim 20 wherein said metal layer is patterned by chlorine plasma etching.

22. The method of claim 20 wherein said metal layer is patterned by fluorine plasma etching.

23. The method of claim 16 further comprising the step of processing said polymeric layer to produce an undercut replica pattern by exposing the article product resulting from the fabrication method of claim 1 to an agent which isotropically attacks portions of said polymeric layer bared during patterning of said processing layer.

24. The method of claim 23 further comprising the step of depositing metal onto the article product resulting from the fabrication method of claim 23.

25. A method for fabricating an article which includes a surface, comprising the steps of:
depositing a resist onto said surface, which resist includes a chalcogenide glass supporting a silver compound-containing material;
exposing selected portions of said chalcogenide glass to energy so as to induce silver migration from said silver compound-containing material into the exposed portions of said chalocogenide glass, thereby defining a pattern of silver-doped chalcogenide glass of reduced solubility in a wet developing agent;
stripping silver compound-containing material unaffected by said energy from the surface of said chalcogenide glass;
treating said chalcogenide glass with said wet developing agent to selectively remove nonexposed portions of said chalcogenide glass to produce a patterned resist characterized in that
the nonexposed portions of said chalcogenide glass removed by said wet developing agent include regions having a first chemical composition and regions having a second chemical composition, the regions having said first chemical composition being interspersed among the regions having said second chemical composition, and a lateral dimension of the regions having said second chemical composition being less than the thickness of said chalcogenide glass, and
said wet developing agent includes first and second chemical components, said first chemical component preferentially etching the regions having said first chemical composition, and the etching rate of said first chemical component being greater than the etching rate of said second chemical component.

26. A method for fabricating an article which includes a surface, comprising the steps of:
depositing a resist on said surface, which resist includes a chalcogenide glass supporting a sacrificial layer;
defining a pattern in said sacrificial layer by removing selected portions of said sacrificial layer;
replicating said pattern in said chalcogenide glass by treating said wet chalcogenide glass with a developing agent which selectively removes the portions of said chalcogenide glass not covered by said patterned sacrificial layer, characterized in that
the portions of said chalcogenide glass removed by said wet developing agent include regions having a first chemical composition and regions having a second chemical composition, the regions having said first chemical composition being interspersed among the regions having said second chemical composition, and a lateral dimension of the regions having said second chemical composition being less than the thickness of said chalcogenide glass; and
said wet developing agent includes first and second chemical components, said first chemical component preferentially etching the regions having said first chemical composition, and the etching rate of said first chemical component being greater than the etching rate of said second chemical component.

27. The method of claim 25 or 26 wherein said chalcogenide glass is a germanium-selenium glass having a nominal composition $Ge_xSe_{1-x}$ where $0.1<x<0.2$, and wherein the regions having said first chemical composition include $GeSe_2$ and the regions having said second chemical composition include Se.

28. The method of claim 27 wherein $0.13 \leq x \leq 0.17$.

29. A product including a surface formed by the process comprising the steps of:
exposing selected portions of a resist, on said surface, to energy; and
treating said resist with a wet developing agent to remove nonexposed portions of said resist, characterized in that
the nonexposed portions of said resist removed by said wet developing agent include regions having a first chemical composition and regions having a second chemical composition, the regions having said first chemical composition being interspersed among the regions having said second chemical composition, and a lateral dimension of said regions having said second chemical composition being less than the thickness of said resist, and
said wet developing agent includes first and second chemical components, said first chemical component preferentially etching the regions having said first chemical composition, and the etching rate of said first chemical component being greater than the etching rate of said second chemical component.

* * * * *

UNITED STATES PATENT AND TRADEMARK OFFICE
CERTIFICATE OF CORRECTION

PATENT NO. : 4,454,221

DATED : June 12, 1984

INVENTOR(S) : Cheng-Hsuan Chen, Edith C. Ong, James C. Phillips and King L. Tai

It is certified that error appears in the above-identified patent and that said Letters Patent is hereby corrected as shown below:

Column 8, line 28, "$Ge_2$" should read --$Ge_x$--.

Signed and Sealed this

Twenty-first Day of May 1985

[SEAL]

Attest:

DONALD J. QUIGG

Attesting Officer     Acting Commissioner of Patents and Trademarks